US012696691B2

(12) United States Patent
Zhang et al.

(10) Patent No.: US 12,696,691 B2
(45) Date of Patent: Jul. 28, 2026

(54) RESISTIVE RANDOM-ACCESS MEMORY (RRAM) DEVICES WITH INTERFACE LAYERS

(71) Applicant: TetraMem Inc., Fremont, CA (US)

(72) Inventors: Minxian Zhang, Amherst, MA (US); Ning Ge, Danville, CA (US)

(73) Assignee: TetraMem Inc., San Jose, CA (US)

( * ) Notice: Subject to any disclaimer, the term of this patent is extended or adjusted under 35 U.S.C. 154(b) by 526 days.

(21) Appl. No.: 18/335,026

(22) Filed: Jun. 14, 2023

(65) Prior Publication Data

US 2024/0423105 A1    Dec. 19, 2024

(51) Int. Cl.
H10N 70/00        (2023.01)
H10B 63/00        (2023.01)

(52) U.S. Cl.
CPC ......... H10N 70/8833 (2023.02); H10B 63/30 (2023.02); H10B 63/80 (2023.02); H10N 70/023 (2023.02); H10N 70/026 (2023.02); H10N 70/841 (2023.02)

(58) Field of Classification Search
CPC ............. H10N 70/8833; H10N 70/023; H10N 70/026; H10N 70/841; H10B 63/30; H10B 63/80
See application file for complete search history.

(56) References Cited

U.S. PATENT DOCUMENTS

| | | | |
|---|---|---|---|
| 11,271,040 B1 | 3/2022 | Stewart et al. | |
| 2021/0066589 A1 | 3/2021 | Zhang et al. | |
| 2022/0006008 A1 | 1/2022 | Zhang et al. | |
| 2024/0023466 A1* | 1/2024 | Zhang ................ | G11C 13/0007 |

FOREIGN PATENT DOCUMENTS

TW        202312168 A      3/2023

OTHER PUBLICATIONS

International Searching Authority (ISA)/US, International Search Report for PCT/US2024/034178, mailed Sep. 3, 2024, 2 pages.
International Searching Authority (ISA)/US, Written Opinion for PCT/US2024/034178, mailed Sep. 3, 2024, 6 pages.

* cited by examiner

*Primary Examiner* — Samuel A Gebremariam
(74) *Attorney, Agent, or Firm* — Jaffery Watson Hamilton & DeSanctis LLP

(57)        ABSTRACT
The present disclosure relates to resistive random-access memory (RRAM) devices. An RRAM device may include a first electrode, an interface layer fabricated on the first electrode, a switching oxide layer comprising at least one transition metal oxide; and a second electrode fabricated on the switching oxide layer. The interface layer may include a discontinuous layer of a dielectric material and a conductive material deposited in the discontinuous layer of the dielectric material. The interface layer is positioned between the first electrode and the switching oxide layer. The dielectric material may be and/or include $Al_2O_3$, $SiO_2$, $Si_3N_4$, MgO, $Y_2O_3$, $Gd_2O_3$, $Sm_2O_3$, $CeO_2$, $Er_2O_3$, $La_2O_3$, etc. The conductive material may include a metal, a conductive oxide, a conductive nitride, etc.

20 Claims, 9 Drawing Sheets

Bitline (BL) 211

200

201

Select Line
(SEL) 213

D

G

203

S

Wordline (WL) 215

400

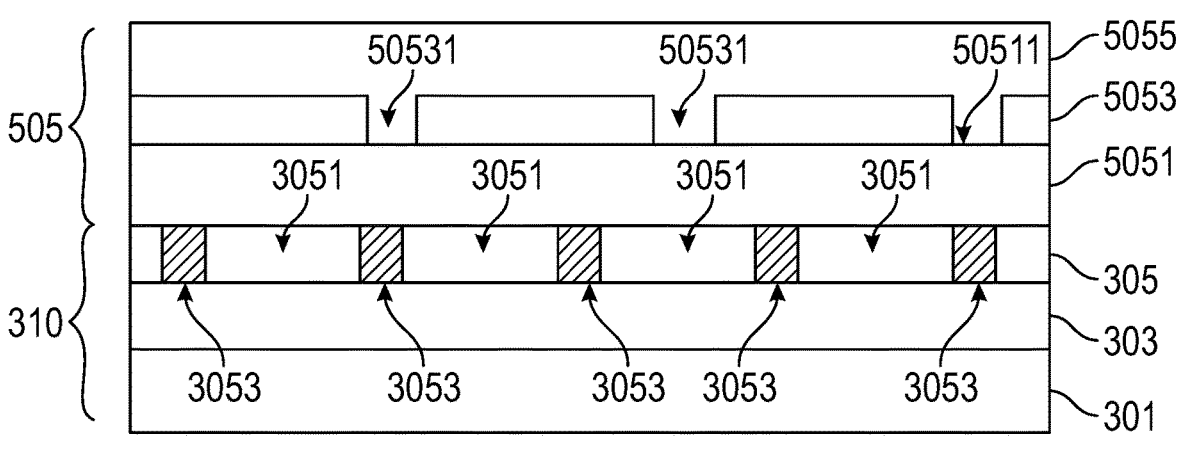
FIG. 5A
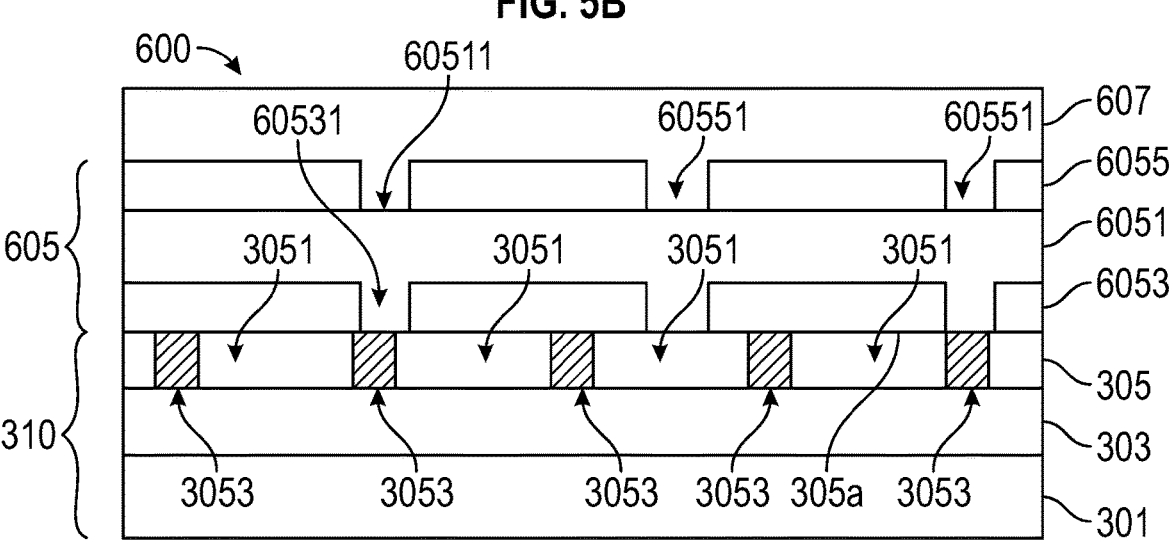
FIG. 5B
FIG. 6

<u>700</u>

800

RESISTIVE RANDOM-ACCESS MEMORY (RRAM) DEVICES WITH INTERFACE LAYERS

TECHNICAL FIELD

The implementations of the disclosure relate generally to resistive random-access memory (RRAM) devices and, more specifically, to RRAM devices with interface layers and methods for fabricating the same.

BACKGROUND

A resistive random-access memory (RRAM) device is a two-terminal passive device with tunable and non-volatile resistance. The resistance of the RRAM device may be electrically switched between a high-resistance state (HRS) and a low-resistance state (LRS) by applying suitable programming signals to the RRAM device. RRAM devices may be used to form crossbar arrays that may be used to implement in-memory computing applications, non-volatile solid-state memory, image processing applications, neural networks, etc.

SUMMARY

The following is a simplified summary of the disclosure to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an RRAM device may include a first electrode, a first interface layer fabricated on the first electrode, a switching oxide layer comprising at least one transition metal oxide; and a second electrode fabricated on the switching oxide layer. The first interface layer may include a discontinuous layer of a first dielectric material and a conductive material deposited in the discontinuous layer of the first dielectric material. The first interface layer is positioned between the first electrode and the switching oxide layer. The first dielectric material may be and/or include $Al_2O_3$, $SiO_2$, $Si_3N_4$, MgO, $Y_2O_3$, $Gd_2O_3$, $Sm_2O_3$, $CeO_2$, $Er_2O_3$, $La_2O_3$, etc. The conductive material may include a metal, a conductive oxide, a conductive nitride, etc.

In some embodiments, the first dielectric material includes at least one of $Al_2O_3$, $SiO_2$, $Si_3N_4$, MgO, $Y_2O_3$, $Gd_2O_3$, $Sm_2O_3$, $CeO_2$, $Er_2O_3$, or $La_2O_3$.

In some embodiments, the conductive material includes a metal.

In some embodiments, the conductive material includes a conductive oxide.

In some embodiments, the conductive material includes a conductive nitride.

In some embodiments, the discontinuous layer of the first dielectric material includes a plurality of islands of the first dielectric material, wherein the conductive material is deposited between the plurality of islands of the first dielectric material.

In some embodiments, the apparatus further includes a second interface layer fabricated between the switching oxide layer and the second electrode, wherein the second interface layer includes a discontinuous layer of a second dielectric material.

In some embodiments, the second dielectric material includes at least one of $Al_2O_3$, $SiO_2$, $Si_3N_4$, MgO, $Y_2O_3$, $Gd_2O_3$, $Sm_2O_3$, $CeO_2$, $Er_2O_3$, or $La_2O_3$.

In some embodiments, the transition metal oxide includes at least one of HfOx or TaOy, wherein $x \leq 2.0$, and wherein $y \leq 2.5$.

In some embodiments, the switching oxide layer includes: a first base oxide layer including the at least one transition metal oxide; and a first geometric confining layer fabricated on the first base oxide layer, wherein the first geometric confirming layer includes a first plurality of pin-holes.

In some embodiments, the switching oxide layer further includes a second base oxide layer fabricated on the first geometric confining layer.

In some embodiments, the second base oxide layer includes at least one of $TaO_x$, $HfO_x$, $TiO_x$, or $ZrO_x$.

In some embodiments, the switching oxide layer includes a second geometric confining layer includes a second plurality of pin-holes.

According to one or more aspects of the present disclosure, a method for fabricating a resistive random-access memory (RRAM) device is provided. The method includes fabricating a first interface layer on a first electrode; fabricating, on the first interface layer, a switching oxide layer including at least one transition metal oxide; and fabricating a second electrode on the switching oxide layer. The first interface layer includes a discontinuous layer of a first dielectric material and a conductive material deposited in the discontinuous layer of the first dielectric material.

In some embodiments, the first dielectric material includes at least one of $Al_2O_3$, $SiO_2$, $Si_3N_4$, MgO, $Y_2O_3$, $Gd_2O_3$, $Sm_2O_3$, $CeO_2$, $Er_2O_3$, or $La_2O_3$.

In some embodiments, fabricating the first interface layer includes depositing the first dielectric material and the conductive material using at least one of an atomic layer deposition technique or a co-sputter deposition technique.

In some embodiments, the conductive material includes at least one of a metal, a conductive oxide, or a conductive nitride.

In some embodiments, the method further includes fabricating a second interface layer on the switching oxide layer, wherein the second interface layer includes a discontinuous layer of a second dielectric material, and wherein the second electrode is fabricated on the second interface layer.

In some embodiments, the second dielectric material includes at least one of $Al_2O_3$, $SiO_2$, $Si_3N_4$, MgO, $Y_2O_3$, $Gd_2O_3$, $Sm_2O_3$, $CeO_2$, $Er_2O_3$, or $La_2O_3$.

In some embodiments, the transition metal oxide includes at least one of $HfO_x$ or $TaO_y$, wherein $x \leq 2.0$, and wherein $y \leq 2.5$.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIGS. 5A and 5B are block diagrams illustrating structures relating to a process for fabricating an RRAM device in accordance with some implementations of the present disclosure.

FIG. 6 is a schematic diagram illustrating a cross-sectional view of an example RRAM device in accordance with some implementations of the present disclosure.

DETAILED DESCRIPTION

Figure 1:
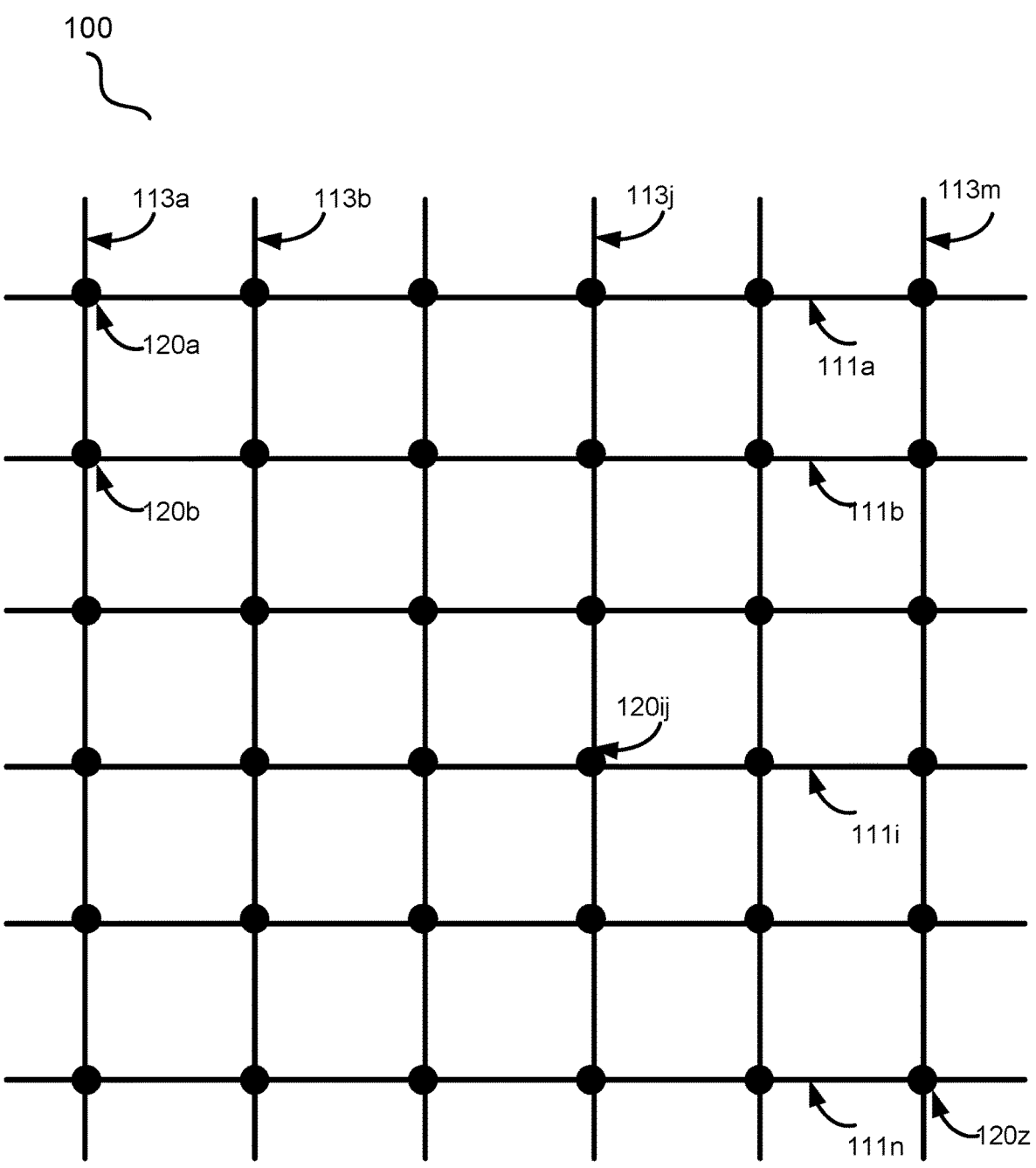
FIG. 1 is a schematic diagram illustrating an example crossbar circuit in accordance with some embodiments of the present disclosure.

Aspects of the disclosure provide resistive random-access memory (RRAM) devices and methods for fabricating the RRAM devices. An RRAM device is a two-terminal passive device with tunable resistance. The RRAM device may include a first electrode, a second electrode, and a switching oxide layer positioned between the first electrode and the second electrode. In some embodiments, the first electrode and the second electrode may be a bottom electrode and a top electrode of the RRAM device, respectively. In some embodiments, the first electrode and the second electrode may be a top electrode and a bottom electrode of the RRAM device, respectively. The first electrode may include a non-reactive metal, such as platinum (Pt), palladium (Pd), etc. The second electrode may include a reactive metal, such as tantalum (Ta). The electrode including the non-reactive metal is also referred to herein as the "non-reactive electrode." The electrode including the reactive metal is also referred to herein as the "reactive electrode." The switching oxide layer may include a transition metal oxide, such as hafnium oxide ($HfO_x$) or tantalum oxide ($TaO_x$). The RRAM device may be in an initial state or virgin state and may have an initial high resistance before it is subject to a suitable electrical stimulation (e.g., a voltage or current signal applied to the RRAM device). The RRAM device may be tuned to a lower resistance state from the virgin state via a forming process or from a high-resistance state (HRS) to a lower resistance state (LRS) via a forming process. The forming process may refer to programming a device starting from the virgin state. The setting process may refer to programming a device starting from the high resistance state (HRS) not in the virgin state. After the reactive metal electrode is deposited on the switching oxide, the reactive metal can absorb oxygen from the switching oxide layer and create oxygen vacancies in the switching oxide layer, and oxygen ions can migrate in the switching oxide through a vacancy mechanism. During a forming process, a suitable programming signal (e.g., a voltage or current signal) may be applied to the RRAM device, which may cause a drift of oxygen ions to migrate from the switching oxide to the reactive electrode. As a result, a conductive channel or filament may form through the switching oxide layer (e.g., from the reactive electrode to the non-reactive electrode). The RRAM device may then be reset to a high-resistance state by applying a reset signal (e.g., a voltage signal, a current signal) to the RRAM device. The application of the reset signal to the RRAM device may cause oxygen to migrate back to the switching oxide layer and may thus interrupt the conductive filament. The RRAM device may be electrically switched between a high-resistance state and a low-resistance state by applying suitable programming signals (e.g., voltage signals, current signals, etc.) to the RRAM device. In a crossbar array circuit, the programming signals may be provided to the designated RRAM device via a selector, such as a transistor.

In accordance with some embodiments of the present disclosure, an RRAM device may include a first electrode, a switching oxide layer, a second electrode fabricated on the switching oxide layer, and an interface layer positioned between the first electrode and the switching oxide layer. The interface layer includes a discontinuous layer of a high dielectric material interspersed with particles, atoms, and/or molecules of one or more conductive materials. The dielectric material may include, for example, $Al_2O_3$, $SiO_2$, $Si_3N_4$, MgO, $Y_2O_3$, $Gd_2O_3$, $Sm_2O_3$, $CeO_2$, $Er_2O_3$, $La_2O_3$. The conductive material(s) may include, for example, a metal (e.g., Pt, Pd, Ir, Co, Ru, Rh, etc.), a conductive oxide (such as $IrO_2$, $RuO_2$), a conductive nitride (e.g., TiN, TaN, etc.), etc. The discontinuous layer of the dielectric material may be regarded as being a discontinuous film (e.g., islands) of the dielectric material with a plurality of pin-holes. The pin-holes are filled with the particles and/or the atoms of the conductive material(s). As such, the conductive material(s) may be deposited in the pin-holes and on the first electrode. The conductive materials in the interface layer and the materials in the first electrode may or may not be the same.

The thickness of the interface layer and/or the discontinuous film of the dielectric material may be approximately of the order of magnitude of the diameter of a single atom or molecule of the dielectric material. When the conductive materials are dispersed within this thin dielectric interface layer, it forms a dielectric layer interspersed with "metallic channels" deriving from the conductive atoms or particles.

This interface layer may reduce the size of a filament formed in the RRAM device, as the dimension of the filament may be constrained by the size of the conductive particles. Consequently, this arrangement may decrease the operation energies, specifically the forming and switching voltage and current, by channeling the electric field and current through the conductive particles within the discontinuous films. The interface layer may thus reduce both the forming voltages and the switching voltages of the RRAM device. The conductive materials deposited in the interface layer may smooth the surface morphology of the interface layer and may cause the electric field to be concentrated on the conductive particles, as opposed to the entire area of the first electrode, thereby facilitating the device's electrical operations.

Accordingly, the interface layer design as described herein may enhance the device's electrical operations, particularly by reducing both the forming voltages and switching voltages and minimizing the required operation energy. For example, RRAM devices with lower operating voltages may be programmed with fewer pulses using incremental step pulse programming schemes.

FIG. 1 is a schematic diagram illustrating an example 100 of a crossbar circuit in accordance with some embodiments of the present disclosure. As shown, crossbar circuit 100 may include a plurality of interconnecting electrically conductive wires, such as one or more row wires 111a, 111b, . . . , 111i, . . . , 111n, and column wires 113a, 113b, . . . 113j, . . . , 113m for an n-row by m-column crossbar array. The crossbar circuit 100 may further include cross-point devices 120a, 120b, . . . , 120z, etc. Each of the cross-point devices may connect a row wire and a column wire. For example, the cross-point device 120ij may connect the row wire 111i and the column wire 113j. In some embodiments, crossbar circuit 100 may further include digital to analog converters (DAC, not shown), analog to digital converters (ADC, not shown), switches (not shown), and/or any other suitable circuit components for implementing a crossbar-based apparatus. The number of the column wires 113a-m and the number of the row wires 111a-n may or may not be the same.

Row wires 111 may include a first row wire 111a, a second row wire 111b, . . . , 111i, . . . , and an n-th row wire 111n. Each of row wires 111a, . . . , 111n may be and/or include any suitable electrically conductive material. In some embodiments, each row wire 111a-n may be a metal wire.

Column wires 113a-m may include a first column wire 113a, a second column wire 113b, . . . , and an m-th column wire 113m. Each of column wires 113a-m may be and/or include any suitable electrically conductive material. In some embodiments, each column wire 113a-m may be a metal wire.

Each cross-point device 120a-z may be and/or include any suitable device with tunable resistance, such as a memristor, PCM (phase change memory) devices, floating gates, spintronic devices, resistive random-access memory (RRAM), static random-access memory (SRAM), etc. In some embodiments, one or more cross-point devices 120 may include an RRAM device as described in connection with FIGS. 3A-6.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is output via each column wire and may be accumulated according to Kirchhoff's current law. This may enable in-memory computing (IMC) via parallel multiplications and summations performed in the crossbar arrays.

Figure 2:
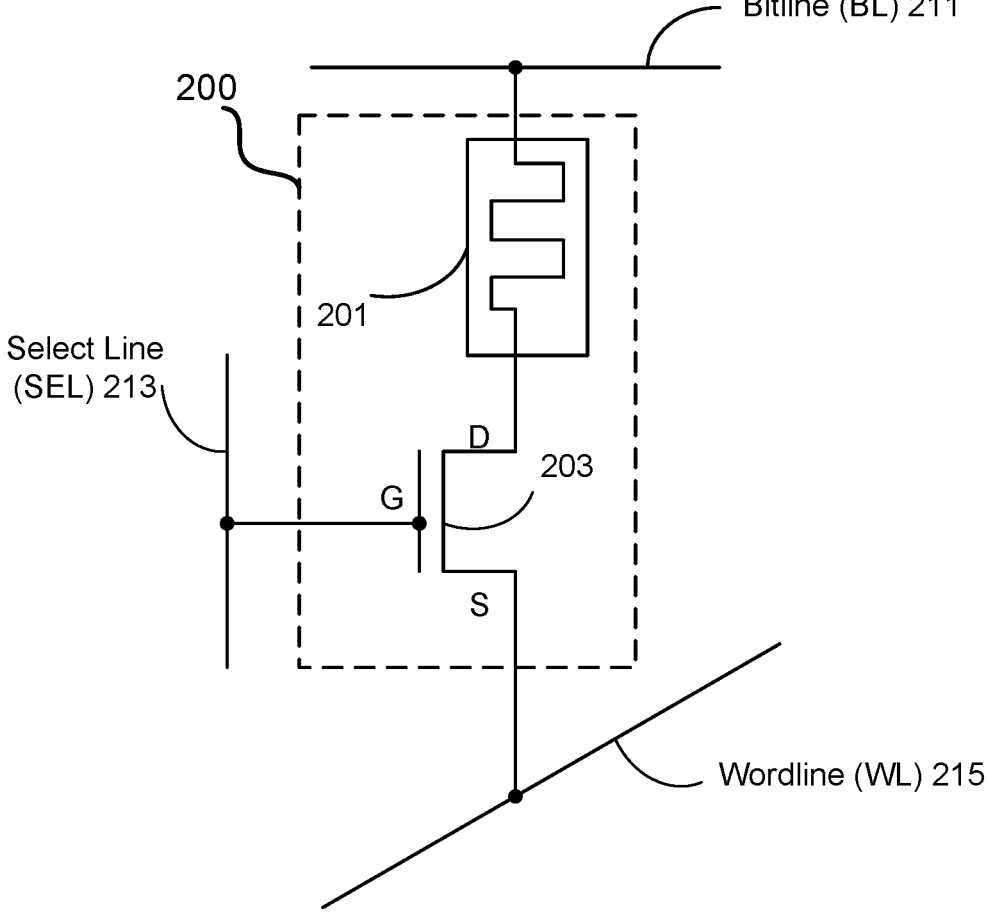
FIG. 2 is a schematic diagram illustrating an example of a cross-point device in accordance with some embodiments of the present disclosure.

FIG. 2 is a schematic diagram illustrating an example 200 of a cross-point device in accordance with some embodiments of the present disclosure. As shown, cross-point device 200 may connect a bitline (BL) 211, a select line (SEL) 213, and a wordline (WL) 215. The bitline 211 and the wordline 215 may be a column wire and a row wire as described in connection with FIG. 1, respectively.

Cross-point device 200 may include an RRAM device 201 and a transistor 203. A transistor may include three terminals, which may be marked as gate (G), source(S), and drain (D), respectively. The transistor 203 may be serially connected to RRAM device 201. As shown in FIG. 2, the first electrode of the RRAM device 201 may be connected to the drain of transistor 203. The second electrode of the RRAM device 201 may be connected to the bitline 211. The source of the transistor 203 may be connected to the wordline 215. The gate of the transistor 203 may be connected to the select line 213. RRAM device 201 may include one or more RRAM devices as described in connection with FIGS. 3A-6 below. Cross-point device 200 may also be referred to as a one-transistor-one-resistor (1T1R) configuration. The transistor 203 may perform as a selector as well as a current controller, which may set the current compliance, to the RRAM device 201 during programming. The gate voltage on transistor 203 can set current compliances to cross-point device 200 during programming and can thus control the conductance and analog behavior of cross-point device 200. For example, when cross-point device 200 is set from a high-resistance state to a low-resistance state, a set signal (e.g., a voltage signal, a current signal) may be provided via the bitline (BL) 211. Another voltage, also referred to as a select voltage or gate voltage, may be applied via the select line (SEL) 213 to the transistor gate to open the gate and set the current compliance, while the wordline (WL) 215 may be set to ground. When cross-point device 200 is reset from the low-resistance state to the high-resistance state, a gate voltage may be applied to the gate of the transistor 203 via the select line 213 to open the transistor gate. Meanwhile, a reset signal may be sent to the RRAM device 201 via the wordline 215, while the bitline 211 may be set to ground.

FIGS. 3A, 3B, 3C, and 3D illustrate cross-sectional views of structures for fabricating an RRAM device 300a in accordance with some embodiments of the present disclosure. FIGS. 3E and 3F illustrate RRAM devices 300b and 300c, which correspond to RRAM device 300a at different resistance states.

Figure 3A:
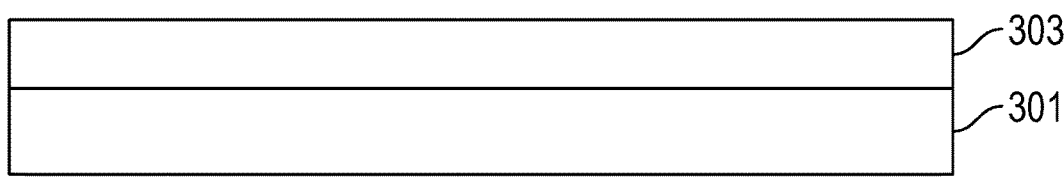
FIGS. 3A, 3B, 3C, and 3D illustrate cross-sectional views of structures for fabricating an RRAM device in accordance with some embodiments of the present disclosure.

As shown in FIG. 3A, a substrate 301 may be provided. A first electrode 303 may be fabricated on the substrate 301. The substrate 301 may include one or more layers of any suitable material that may serve as a substrate for an RRAM device, such as silicon (Si), silicon dioxide ($SiO_2$), silicon nitride ($Si_3N_4$), aluminum oxide ($Al_2O_3$), aluminum nitride (AlN), etc. In some embodiments, the substrate 301 may include diodes, transistors, interconnects, integrated circuits, one or more other RRAM devices, etc. In some embodiments, the substrate 301 may include a driving circuit including one or more electrical circuits (e.g., an array of electrical circuits) that may be individually controllable. In some embodiments, the driving circuit may include one or more complementary metal-oxide-semiconductor (CMOS) drivers.

The first electrode 303 may include any suitable material that is electronically conductive and non-reactive to the switching oxide layer to be fabricated on the first electrode 303 (also referred to as the "non-reactive" material). As an example, the first electrode 303 may include a non-reactive metal, such as platinum (Pt), palladium (Pd), etc. As another example, the first electrode 303 may include a metal nitride having a suitable chemical stability so that it will not react with oxygen during RRAM switching, such as titanium nitride (TiN), tantalum nitride (TaN), etc. The first electrode 303 may also be referred to as the "non-reactive electrode."

Figure 3B:
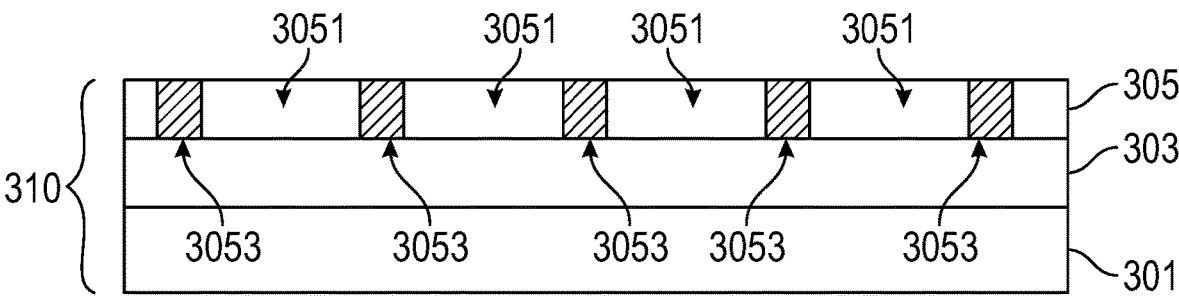

As shown in FIG. 3B, an interface layer 305 may be deposited on the first electrode 303. The interface layer 305 may include a discontinuous layer of a dielectric material and one or more conductive materials deposited in the discontinuous layer of the dielectric material. For example, in a cross-sectional view, the discontinuous layer of the dielectric layer may include islands 3051 of the first dielectric material that are separated by a plurality of pin-holes (not shown in FIG. 3B) that are randomly dispersed in the discontinuous layer. The pin-holes are filled by particles and/or atoms of the conductive material 3053. It is to be noted that the islands 3051 of the first dielectric material as shown in the cross-section view of the discontinuous layer of the dielectric material may connect to each other in a dimension perpendicular to the cross-sectional view. As such, the discontinuous layer of the dielectric material including the islands of the dielectric material may also be regarded as a discontinuous layer including the pin-holes. As shown, the conductive material(s) may be deposited in the discontinuous layer of the dielectric layer (e.g., the pin-holes) and on the first electrode 303. One or more portions of the conductive materials 3053 in the interface layer 305 may directly contact the first electrode 303. The substrate 301, the first electrode 303, and the interface layer 305 may also be referred to herein collectively as a device stack 310.

Examples of the dielectric material may include $Al_2O_3$, $SiO_2$, $Si_3N_4$, MgO, $Y_2O_3$, $Gd_2O_3$, $Sm_2O_3$, $CeO_2$, $Er_2O_3$, $La_2O_3$, etc. The dielectric material may be more chemically stable than the transition metal oxide in some embodiments. The conductive materials may include, for example, one or more metals (e.g., platinum (Pt) metal, palladium (Pd) metal, iridium (Ir) metal, cobalt (Co) metal, ruthenium (Ru) metal, rhodium (Rh) metal, etc.), conductive oxides ($IrO_2$, $RuO_2$, etc.), conductive nitrides (TiN, TaN, etc.), etc.

As referred to herein, a layer may be regarded as being a discontinuous layer if the layer covers some, but not all, portions of the layer underneath. A discontinuous layer of the dielectric material (e.g., the islands 3051) may be fabricated by depositing the dielectric material to a layer that is not thick enough to form a continuous layer of the dielectric layer. In some embodiments, the thickness of the interface layer and/or the discontinuous film of the dielectric material may be approximately of the order of magnitude of the diameter of a single atom or molecule of the dielectric material. In some embodiments, a thickness of the interface layer 305 may be between about 0.2 nm and about 0.5 nm. In some embodiments, a thickness of the interface layer 305 may be about 0.3 nm. As a more particular example, the thickness of an $Al_2O_3$ monolayer is estimated to be more than the diameter of an Al ion plus the diameter of an oxygen ion, where the diameter of an oxygen ion is 0.252 nm; the diameter of an $Al^{3+}$ ionic is 0.136 nm; and the size of an AlO ion pair is 0.388 nm. As such, an $Al_2O_3$ layer may be discontinuous when the thickness of the $Al_2O_3$ film is less than about 0.4 nm. As another more particular example, the diameter of a $Si^{4+}$ ion is 0.108 nm; the size of an Si—O ionic pair is 0.360 nm. Thus, a complete SiO2 monolayer is often not formed, if the thickness of a deposited SiO2 layer is less than 0.4 nm. In some embodiments, even when the thickness of a deposited film is thicker than 0.4 nm, a dielectric film may still be non-continuous due to the surface energy (or wettability) between the dielectric film and the first electrode.

Figure 3C:
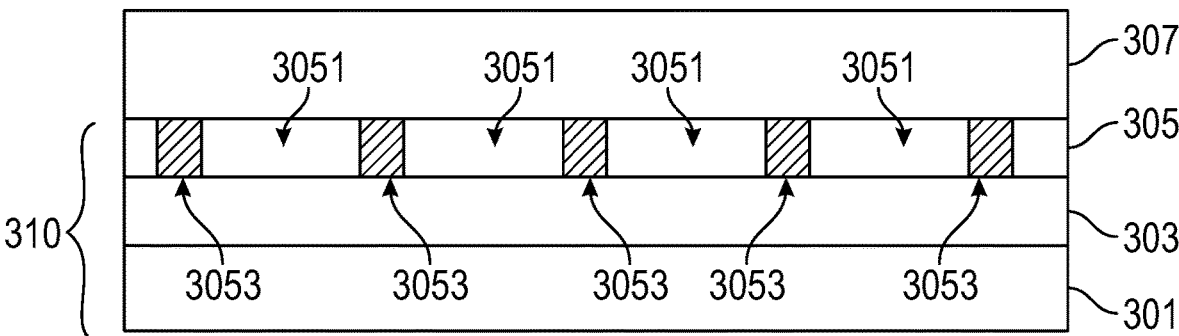

Referring to FIG. 3C, a switching oxide layer 307 may be deposited on the interface layer 305. The switching oxide layer 307 may include one or more transition metal oxides, such as $TaO_x$, $HfO_x$, $TiO_x$, $NbO_x$, $ZrO_x$, etc., in binary oxides, ternary oxides, and high order oxides. In some embodiments, the chemical stability of the non-reactive material in the first electrode 303 may be higher than that of the transition metal oxide(s) in switching oxide layer 307. In some embodiments, the transition metal oxide(s) include at least one of $HfO_x$ or $TaO_x$, wherein x may be used to indicate the oxide being oxygen deficient compared to its full (or terminal) oxide and the value of x may be varied from the oxygen to metal atomic ratio in the stoichiometry of its full oxide, such as $x \leq 2.0$ for $HfO_x$ (where $HfO_2$ being the full oxide), and $x \leq 2.5$ for $TaO_x$ (where $Ta_2O_5$ being the full oxide).

In some embodiments, the switching oxide layer 307 may be and/or include a switching oxide stack 505 of FIG. 5B and/or a switching oxide stack 605 of FIG. 6.

Figure 3D:
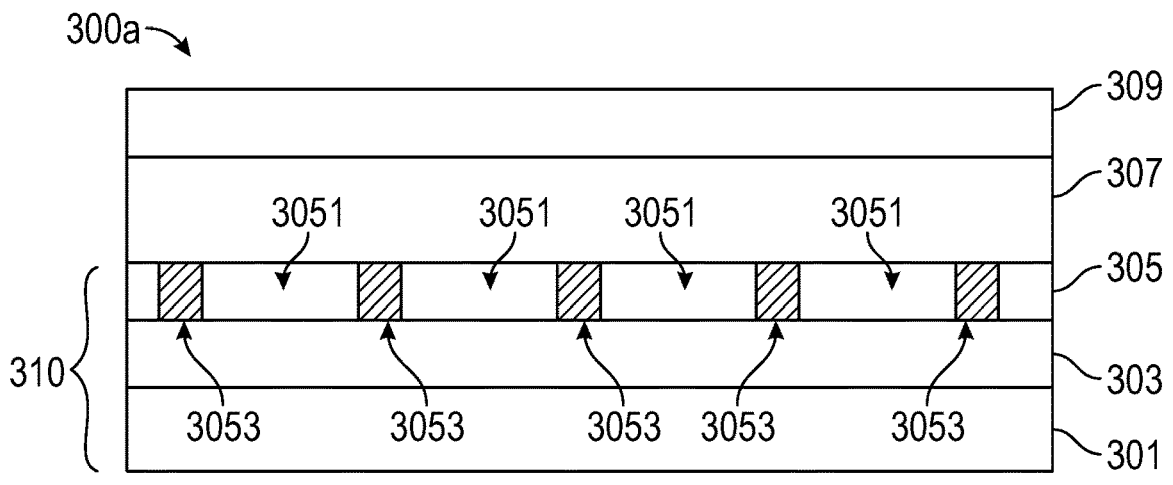
Figure 3E:
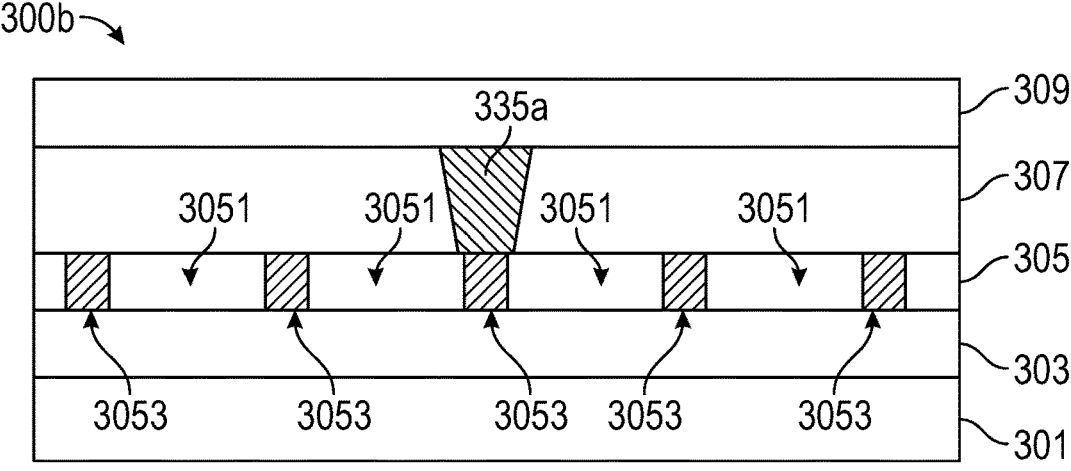
FIGS. 3E and 3F illustrate the RRAM device as depicted in FIG. 3D at different resistance states.
Figure 3F:
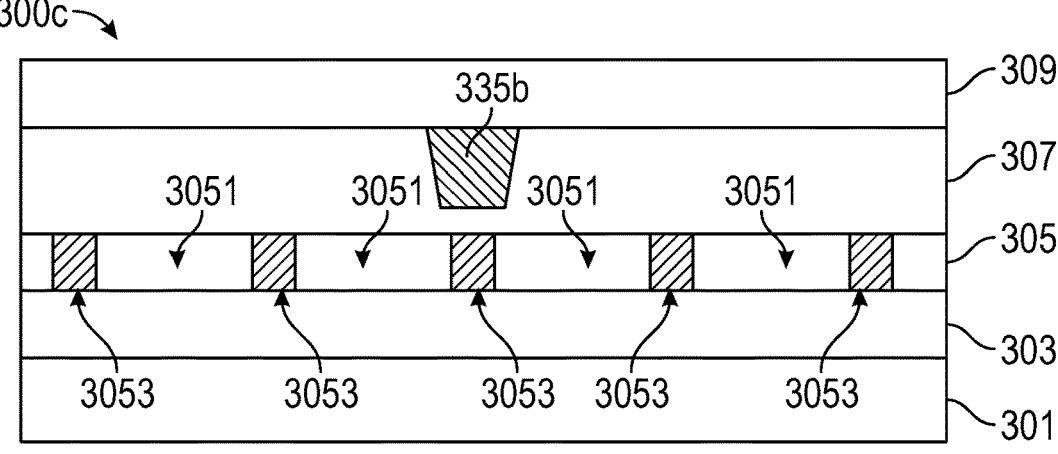

As shown in FIG. 3D, a second electrode 309 may be fabricated on the switching oxide layer 307 to fabricate an RRAM device 300a. The second electrode 309 may include any suitable material that is electronically conductive and reactive to the transition metal oxide(s) in the switching oxide layer 307 (also referred to as the "reactive material"). For example, the metallic material in the second electrode 309 may include Ta, Hf, Ti, TiN, TaN, etc. The second electrode 309 may be reactive to the transition metal oxide(s) in the switching oxide layer 307 and may have suitable oxygen solubility to adsorb some oxygen from the switching oxide layer 307 and create oxygen vacancies in the switching oxide layer 307. In other words, the reactive metallic material(s) in the second electrode 309 may have suitable oxygen solubility and/or oxygen mobility. In some embodiments, the second electrode 309 not only may be able to create oxygen vacancies in the switching oxide layer 307 (e.g., by scavenging oxygen), but also may function as oxygen reservoir or source to the switching oxide layer 307 during cell programming.

In one implementation, the second electrode 309 may include one or more alloys. Each of the alloys may contain two or more metallic elements. Each of the alloys may include a binary alloy (e.g., an alloy containing two metallic elements), a ternary alloy (e.g., an alloy containing three metallic elements), a quaternary alloy (e.g., an alloy containing four metallic elements), a quinary alloy (e.g., an alloy containing five metallic elements), a senary alloy (e.g., an alloy containing six metallic elements), and/or a high order alloy (e.g., an alloy containing more than six metallic elements). In some embodiments, the second electrode 309 may include one or more alloys containing a first metallic element and one or more second metallic elements. Each of the second metallic elements may be less or more reactive to the transition metal oxide in the switching oxide layer than the first metallic element. In some embodiments, the first metallic element may be Ta. The second metallic elements may include one or more of tungsten (W), hafnium (Hf), molybdenum (Mo), niobium (Nb), zirconium (Zr), etc. In some embodiments, the ratio of the first metallic element to the second metallic element(s) in an alloy in the second electrode 309 may be about 50 atomic percent. In some embodiments, the suitable ratio of the first metallic element to the second metallic element in the alloy may be optimized from the entire composition range.

In some implementations, the second electrode 309 may include multiple layers of different metallic materials. For example, the second electrode 309 may include a layer of titanium (Ti) and a layer of tantalum (Ta). The layer of Ti may be much thinner than the layer of Ta. For example, a thickness of the layer of Ti may be between about 0.2 nm and 5 nm. A thickness of the layer of Ta may be about 50 nm. In some embodiments, the thickness of the layer of Ti may be between 0.3 nm and 2 nm. Both Ti and Ta may trap and release oxygen during device operations. The incorporation of the thin Ti layer into the RRAM device may change the virgin resistance of the RRAM device, result in a less abrupt forming process, reduce the forming voltage, reduce the reset current, and reduce voltage and/or current requirements in subsequent operation processes.

RRAM device 300a may have an initial high resistance (also referred to herein as the "virgin resistance") after it is fabricated. The initial resistance of RRAM device 300a may be changed and RRAM device 300a may be switched to a state of a lower resistance via a forming process. For example, a suitable voltage or current may be applied to RRAM device 300a. The application of the voltage to RRAM device 300a may induce the reactive material(s) in the second electrode to absorb oxygen from the switching oxide layer 307 and create oxygen vacancies in the switching oxide layer 307. As a result, a conductive channel (e.g., a filament) which is oxygen vacancy rich may form in the switching oxide layer 307. For example, as illustrated in FIG. 3E, a conductive channel 335a may be formed in the switching oxide layer 307. The conductive channel 335a may be formed from the second electrode 309 to the interface layer 305 across the switching oxide layer 307. As shown, the conductive channel 335a may directly contact one or more portions of the conductive materials in the interface layer 305. As such, the first electrode 303 and the second electrode 309 may be connected via the conductive channel 335a and the conductive material. Unlike a filament formed in a conventional RRAM device that does not include an interface layer as described herein, the conductive channel 335a does not contact the first electrode 303. Instead, the conductive channel 335a contacts the particles and/or atoms of the conductive materials 3053 in the non-continuous dielectric layer 305. The conductive channel 335a is thus smaller than the filament formed in the conventional RRAM device. As such, the presence of the conductive materials in the interface layer 305 may reduce the sizes of the filaments formed in RRAM device 300a and may thus reduce the switching voltages, forming voltages, and operating voltages of RRAM device 300a.

RRAM device 300b may be reset to a high-resistance state. For example, a reset signal (e.g., a voltage signal or a current signal) may be applied to RRAM device 300b during a reset process. In some embodiments, the set signal and the reset signal may have opposite polarity, i.e., a positive signal and a negative signal, respectively, for the directional drift of the oxygen ions in the switching oxide during the set and/or reset operation. The application of the reset signal may cause oxygen to drift back to the switching oxide layer 307 and recombine with one or more of the oxygen vacancies. For example, an interrupted conductive channel 335b as shown in FIG. 3F may be formed in the switching oxide layer 307 during the reset process. As shown, the conductive channel may be interrupted with an oxide gap between the interrupted conductive channel 335b and the conductive materials in the interface layer 305. The lateral dimension of the interrupted conductive channel 335b may be smaller than that of the conductive channel 335a. In some embodiments, the interrupted conductive channel 335b does not continuously connect the first electrode 303 and the second electrode 309. RRAM device 300a-c may be electrically switched between the high-resistance state and the low-resistance state by applying suitable programming signals (e.g., voltage signals, current signals, etc.) to the RRAM device.

FIGS. 4A, 4B, 4C, 4D, and 4E are block diagrams illustrating structures relating to a process for fabricating an RRAM device 400 in accordance with some implementations of the present disclosure. FIG. 4F illustrates the RRAM device 400 at a low resistance state in accordance with some implementations of the present disclosure.

Figure 4A:
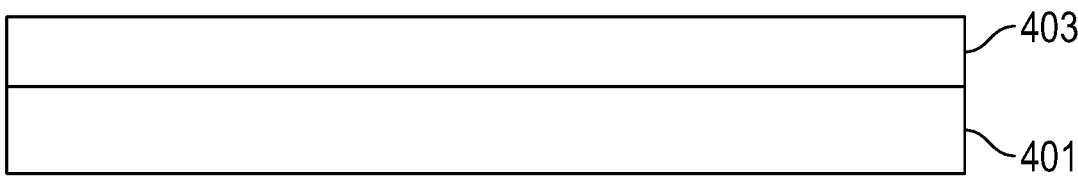
FIGS. 4A, 4B, 4C, 4D, and 4E are block diagrams illustrating cross-sectional views of structures relating to a process for fabricating an RRAM device in accordance with some implementations of the present disclosure.

As shown in FIG. 4A, a substrate 401 may be provided. A first electrode 403 may then be fabricated on the substrate 401. The substrate 401 may be and/or include the substrate 301 as described in connection with FIG. 3A. The first electrode 403 may be and/or include the first electrode 303 as described in connection with FIG. 3A.

Figure 4B:
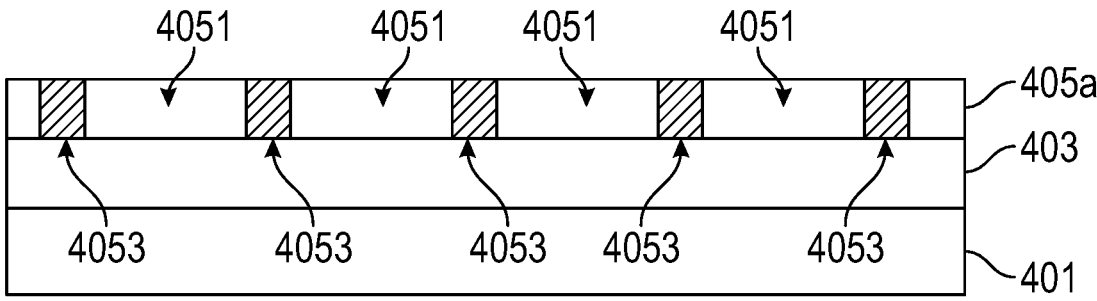

As shown in FIG. 4B, a first interface layer 405a may be fabricated on the first electrode 403. The first interface layer 405a may be and/or include a discontinuous layer of a first dielectric material and one or more conductive materials deposited in the discontinuous layer of the first dielectric material. For example, the discontinuous layer of the first dielectric layer may include islands 4051 of the first dielectric material that are separated by a plurality of pin-holes (not shown in FIG. 4B) that are randomly dispersed in the discontinuous layer of the first dielectric material. The pin-holes are filled by particles and/or atoms of the conductive material 4053.

Examples of the first dielectric material may include $Al_2O_3$, $SiO_2$, $Si_3N_4$, MgO, $Y_2O_3$, $Gd_2O_3$, $Sm_2O_3$, $CeO_2$, $Er_2O_3$, $La_2O_3$, etc. The first dielectric material may be more chemically stable than the transition metal oxide in some embodiments. The conductive materials may include, for example, one or more metals (e.g., platinum (Pt) metal, palladium (Pd) metal, iridium (Ir) metal, cobalt (Co) metal, ruthenium (Ru) metal, rhodium (Rh) metal, etc.), conductive oxides ($IrO_2$, $RuO_2$, etc.), conductive nitrides (TiN, TaN, etc.), etc. The first interface layer 405a may be and/or include an interface layer 305 as described above.

Figure 4C:
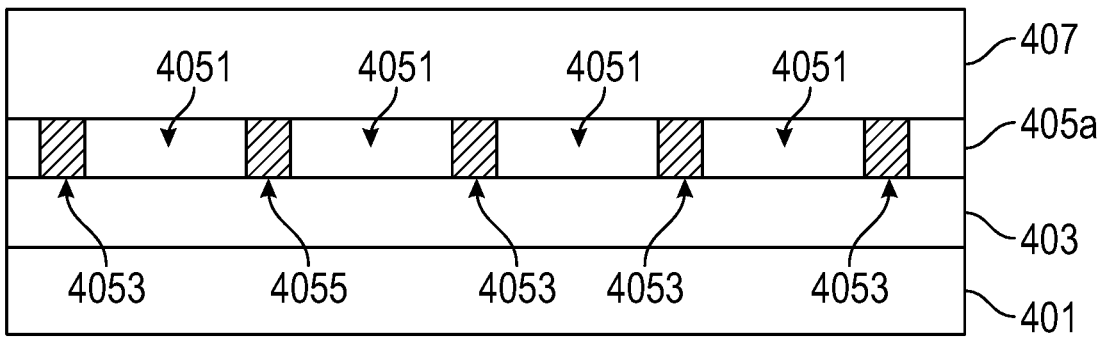

As shown in FIG. 4C, a switching oxide layer 407 may be fabricated on the first interface layer 405a. The switching oxide layer 407 may be and/or include a switching oxide layer 307 as described in connection with FIG. 3C.

Figures 4D, 4E, 4F:
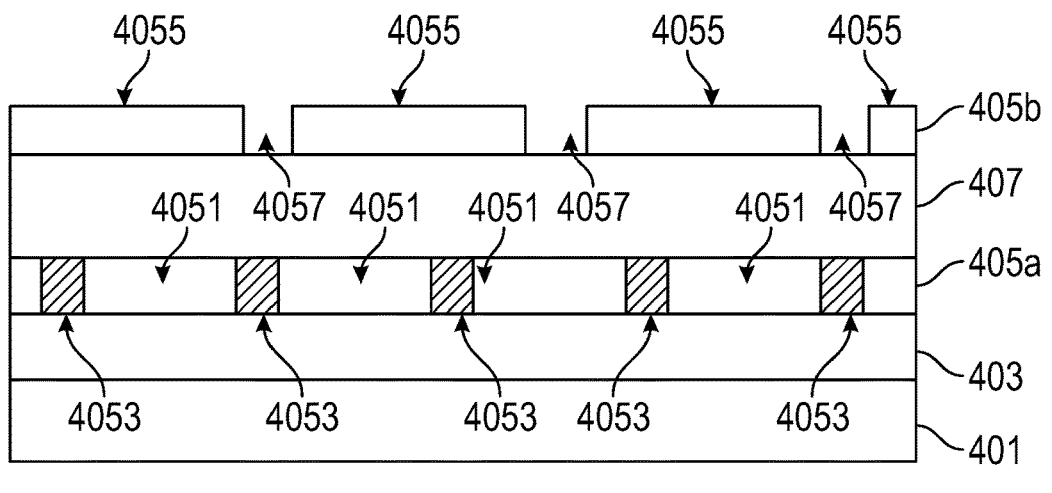
FIG. 4F illustrates the RRAM device as depicted in FIG. 4E at a low resistance state in accordance with some implementations of the present disclosure.

As shown in FIG. 4D, a second interface layer 405b may be fabricated on the switching oxide layer 407. The second interface layer 405b may be and/or include a discontinuous film 4055 of a second dielectric material (e.g., islands of the second dielectric material) and pin-holes 4057 randomly dispersed in the discontinuous layer of the second dielectric material 4055. Examples of the second dielectric material may include $Al_2O_3$, $SiO_2$, $Si_3N_4$, MgO, $Y_2O_3$, $Gd_2O_3$, $Sm_2O_3$, $CeO_2$, $Er_2O_3$, $La_2O_3$, etc. The second dielectric material may be more chemically stable than the transition metal oxide in the switching oxide layer in some embodiments. The second dielectric material and the first dielectric material may or may not be the same. In some embodiments, a thickness of the second interface layer 405b and/or the discontinuous film 4055 may be between about 0.2 nm and about 0.5 nm. In some embodiments, the discontinuous film 4055 may be an $Al_2O_3$ film having a thickness equal to or less than 0.5 nm. In some embodiments, the discontinuous film 4055 may be and/or include an $Al_2O_3$ film having a thickness less than 1 nm.

The conductive materials in the first interface layer 405a and the pin-holes 4057 in the second interface layer 405b may or may not align with each other. In some embodiments, the conductive particles in the first interface layer 405a do not align with the pin-holes in the second interface layer 405b. The misalignment between the conductive particles and the pin-holes 4057 does not affect the functionality of the interface layers and the RRAM switching as described herein.

As shown in FIG. 4E, a second electrode 409 may be deposited on the second interface layer 405b. The second electrode 409 may be and/or include the second electrode 309 as described in connection with FIG. 3D. In some embodiments, during the fabrication of the second electrode 409, one or more portions of the second electrode 409 may be disposed on the switching oxide layer 407 through pin-holes 4057. As such, the second electrode 409 may contact one or more portions of the switching oxide layer 407 through the pin-holes 4057.

As shown in FIG. 4F, when a suitable external voltage is applied to the RRAM device 400, a conductive channel (e.g., a filament) 411 may be formed through the switching oxide layer 407. The effective contact area between the conductive channel 411 and the second electrode 409 is reduced by the presence of the islands 4055. As shown, the conductive channel 411 may directly contact one or more portions of the conductive materials in the interface layer 405a. As such, the first electrode 403 and the second electrode 409 may be connected via the conductive channel 411 and the conductive materials deposited in the interface layer 405a. In some embodiments in which the pin-holes 4057 in interface layer 405b and the particles and/or atoms of the conductive material 4053 in the interface layer 405a may not be completely aligned, the conductive channel 411 may still form as described above. For example, conductive channel 411 may form on a left portion, rather in a middle portion, of the cross-section view of the device. Unlike a filament formed in a conventional RRAM device that does not include an interface layer as described herein, the conductive channel 411 does not contact the first electrode 403. The conductive channel 411 is thus smaller than the filament formed in the conventional RRAM device. As such, the presence of the conductive materials in the interface layer 405a may reduce the sizes of the filaments formed in RRAM device 400 and may thus reduce the switching voltages, forming voltages, and operating voltages of RRAM device 400.

FIGS. 5A and 5B are block diagrams illustrating structures relating to a process for fabricating an RRAM device 500 in accordance with some implementations of the present disclosure.

As shown in FIG. 5A, a switching oxide stack 505 may be fabricated on the device stack 310 as described in connection with FIG. 3B. The switching oxide stack 505 may include a first base oxide layer 5051 formed on the interface layer 305, a geometric confining layer 5053 formed on the first base oxide layer 5051, and a second base oxide layer 5055 formed on the geometric confining layer 5053 and the first base oxide layer 5051.

The geometric confining layer 5053 may include a material that has a relatively large interfacial energy to the layer on which the geometric confining layer 5053 grows. As a result, the geometric confining layer 5053 does not grow uniformly on the surface of the first base oxide layer 5051 and it may not form a continuous interface between second base oxide layer 5055 and the first base oxide layer 5051. Rather, the geometric confining layer 5053 may initially form one or more islands and then form a layer with a plurality of pin-holes, after the geometric confining layer 5053 grows thicker as a result of more materials being deposited. In some implementations, the geometric confining layer 5053 includes one or more discrete islands (e.g., regions that are disconnected from each other) or a film with a plurality of pin-holes 50531. The second base oxide layer 5055 may be filled in and formed on the plurality of pin-holes 50531 and connected to a top surface 50511 of the first base oxide layer 5051.

The geometric confining layer 5053 may reduce the effective filament size or reduce the size of the contact area between a filament and an electrode, thereby reducing the operating current and increasing the device resistance. The geometric confining layer 5053 may have a thickness that is insufficient to form a continuous layer.

In some implementations, the geometric confining layer 5053 may include a discontinuous $Al_2O_3$ film, and the first base oxide layer 5051 and the second base oxide layer 5055 may include $HfO_x$, or $TaO_x$. ALD technologies may be used to deposit the switching oxide stack 505. In some implementations, about 2 nm $HfO_x$ may be deposited over first interface layer 305 using ALD technologies to form the first base oxide layer 5051. Next a few ALD cycles of $Al_2O_3$ may be deposited using ALD technologies to form the geometric confining layer 5053, which may be approximately 0.2 to 0.7 nm thick. The $Al_2O_3$ film having a thickness of approximately 0.2 to 0.7 nm may not be continuous. Next, $HfO_x$ may be deposited using ALD technologies to form the second base oxide layer 5055 for about 2 nm on the geometric confining layer 5053 and a top surface 50511 of the first base oxide layer 5051.

In some implementations, the first base oxide layer 5051 is at least three times as thick as the geometric confining layer 5053; in some implementations, the second base oxide layer 5055 is at least three times as thick as the geometric confining layer 5053. Thus, the first base oxide layer 5051 may be thicker than the geometric confining layer 5053, and the second base oxide layer 5055 may also be thicker than the geometric confining layer 5053. These interface engineering technologies enable the switching oxide stack 505 to maintain its filament forming capabilities, while providing an increased RRAM cell resistance. In some embodiments, the switching oxide stack 505 may be fabricated utilizing the techniques described in U.S. Pat. No. 11,527,712, entitled "LOW CURRENT RRAM-BASED CROSSBAR ARRAY CIRCUITS IMPLEMENTED WITH INTERFACE ENGINEERING TECHNOLOGIES," which is incorporated herein by reference.

As shown in FIG. 5B, a second electrode 507 may be formed on the second base oxide layer 5055 (e.g., on a top surface 50551 of second base oxide layer 5055).

A conductive filament (not shown) may form within the RRAM device 500 and grow on regions in alignment with the plurality of pin-holes 50531. In these ways, the resistance of the RRAM device 500 may be increased, because the contact area between the first base oxide layer 5051 and the second base oxide layer 5055 is reduced. These interface engineering technologies enable a lower operating current for the RRAM device 500.

FIG. 6 is a schematic diagram illustrating a cross-sectional view of an example RRAM device 600 in accordance with some implementations of the present disclosure.

As shown in FIG. 6, the RRAM device 600 may include the device stack 310 (e.g., the substrate 301, the first electrode 303, and the interface layer 305) as described in connection with FIG. 3B. The RRAM device 600 may further include a switching oxide stack 605 fabricated on the interface layer 305 and a second electrode 607 formed on the switching oxide stack 605. The switching oxide stack 605 may include a first geometric confining layer 6053 formed on the interface layer 305, a base oxide layer 6051 formed on the first geometric confining layer 6053 and a first top surface 305a of the interface layer 305, and a second geometric confining layer 6055 formed on the base oxide layer 6051. The second electrode 607 is then formed on the second geometric confining layer 6055 and a second top surface 60511 of the base oxide layer 6051. The first geometric confining layer 6053 is a non-continuous layer that includes many first pin-holes 60531, and the second geometric confining layer 6055 is also a non-continuous layer that includes many second pin-holes 60551. The base oxide layer 6051 is filled and formed in the first pin-holes 60531 and contacted to the first top surface 305a of the interface layer 305 via the first pin-holes 60531. The second electrode 607 is filled and formed in the second pin-holes 60551 and may contact a second top surface 60511 of the base oxide layer 6051 via the second pin-holes 60551. The conductive filament formed within the RRAM device 600 is configured to grow and form in regions in alignment with these pin-holes 60531 and 60551. In these ways, the filament resistance of the RRAM device 600 may be increased, because the contact area between the first electrode 303 and the second electrode 607 is reduced.

In some implementations, the first geometric confining layer 6053 and the second geometric confining layer 6055 may include $Al_2O_3$, and the base oxide layer 6051 may include $HfO_x$, or $TaO_x$. ALD technologies may be used to deposit the switching oxide stack 605. In some implementations, 5 cycles of $Al_2O_3$ may be deposited using ALD technologies to form the first geometric confining layer 6053, which may be approximately 0.5 nm thick. The $Al_2O_3$ film having a 0.5 nm thickness or less may not be continues, because an $Al_2O_3$ film becomes continuous when having a thickness greater than 1 nm. In some implementations, the base oxide layer 6051 is at least 3 times as thick as the first geometric confining layer 6053, or the second geometric confining layer 6055, or both. As such, the base oxide layer 6051 is thicker than the first geometric confining layer 6053, or the second geometric confining layer 6055, or both. This allows the switching oxide stack 605 to maintain its filament forming capabilities with an increased resistance. The first geometric confining layer 6053 and the second geometric confining layer 6055 may or may include the same materials. In some embodiments, the switching oxide stack 605 may be fabricated utilizing the techniques described in U.S. Pat. No. 11,527,712, entitled "LOW CURRENT RRAM-BASED CROSSBAR ARRAY CIRCUITS IMPLEMENTED WITH INTERFACE ENGINEERING TECHNOLOGIES," which is incorporated herein by reference.

Figure 7:
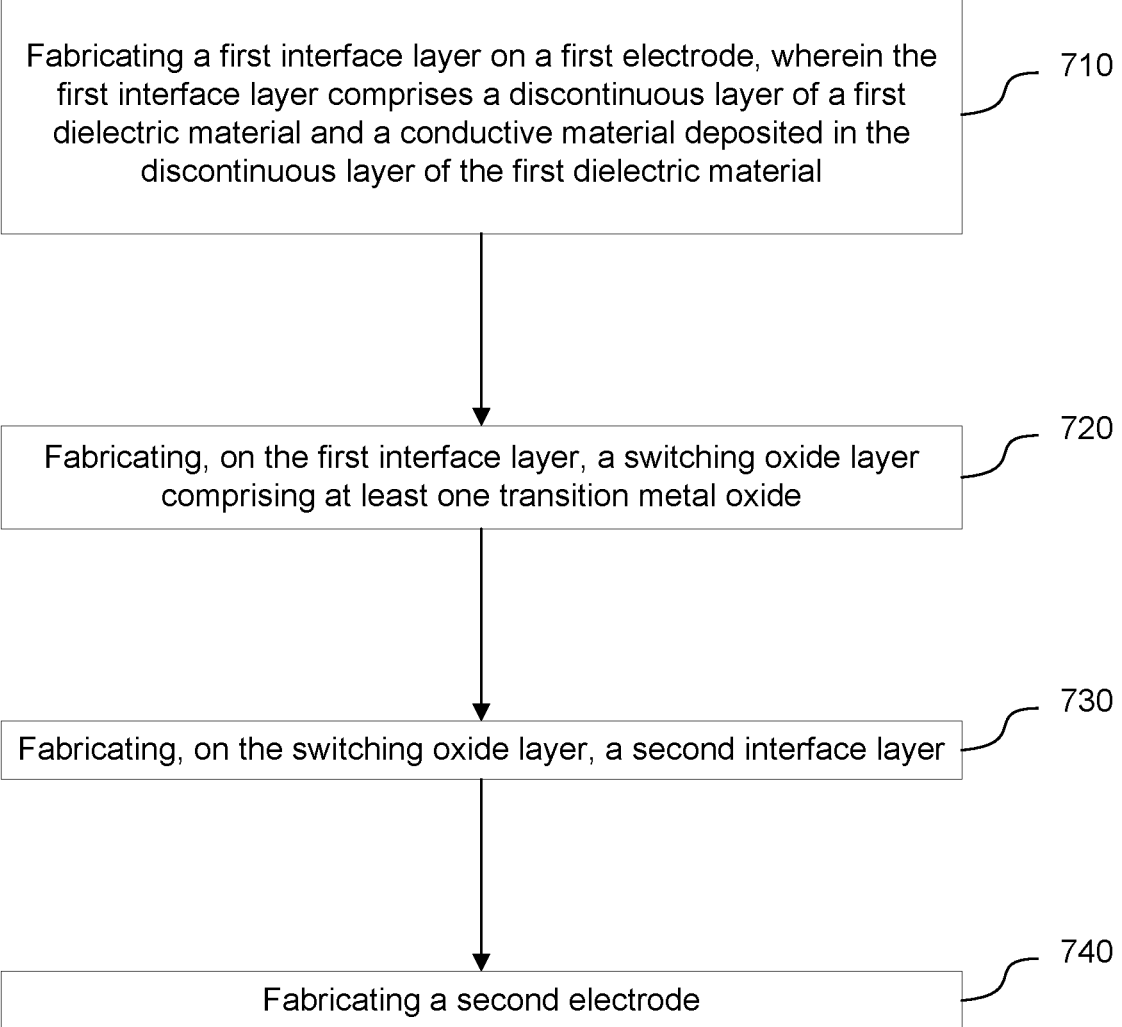
FIG. 7 is a flow diagram illustrating an example of a process for fabricating an RRAM device according to some embodiments of the disclosure.

FIG. 7 is a flow diagram illustrating an example 700 of a process for fabricating an RRAM device according to some embodiments of the disclosure.

Process 700 may start at block 710, wherein a first interface layer is fabricated on a first electrode. The first interface layer may include a discontinuous layer of a first dielectric material and a conductive material deposited in the discontinuous layer of the first dielectric material. The first interface layer may be and/or include the interface layer 305 of FIG. 3D. The interface layer may be fabricated using Atomic Layer Deposition (ALD), Physical Vapor Deposition (PVD), Chemical Vapor Deposition (CVD), or any other suitable deposition techniques. For example, precursors for metal Pt (MeCpPtMe3 or (trimethyl) methyl-cyclopentadienyl platinum (IV)), precursors for metal Pd ((Pd (hfac) 2 or Palladium (II) hexafluoroacetylacetonate), precursors for metal Ir (TICP, or (Tricarbonyl (1,2,3-η)-1,2,3-tri (tert-butyl)-cyclopropenyl iridium (C18H27IrO3))), precursors for metal Co (CoCl2 (TMEDA) (TMEDA=N,N,N′,N′- tetramethylethylenediamine)), precursors for metal Ru (Bis (ethylcyclopentadienyl) ruthenium (II)), precursors for metal Rh (CpRh (CO) 2 Cp=cyclopentadienyld), etc. may be used to fabricate the first interface layer in an ALD process. ALD $IrO_2$ and $RuO_2$ may also be used to fabricate the first interface layer. ALD TiN and TaN may be used to fabricate the first interface layer. In some embodiments, the fabrications of the first interface layer may involve ALD deposition of particles and/or atoms of the conductive materials using one to two cycles (individual conductive particles or atoms sparsely distributed on the first electrode surface). The dielectric materials may then be deposited to fill the spaces between the conductive particles without covering the particles and/or atoms of the conductive materials using a number of subsequent cycles (e.g., one, two, . . . , five cycles in some embodiments). In some embodiments, the fabrication of the interface layer 305 may involve co-depositing the conductive materials and the dielectric materials on the first electrode using co-sputter deposition techniques.

At block 720, a switching oxide layer may be fabricated on the first interface layer. The switching oxide layer may include at least one transition metal oxide. The transition metal oxides may include, e.g., $HfO_x$, or $TaO_x$. For example, fabricating the switching oxide layer may involve depositing $HfO_x$, utilizing an atomic layer deposition (ALD) technique, a physical vapor deposition (PVD) technique, a reactive sputtering of Hf technique, and/or any other suitable deposition technique. The switching oxide layer may be and/or include switching oxide layer 307 as described in connection with FIG. 3C, switching oxide layer 407 of FIG. 4C, switching oxide stack 505 of FIG. 5B, and/or switching oxide stack 605 of FIG. 6.

In some embodiments, a second interface layer (ILB) may be fabricated on the switching oxide layer at block 730. In some embodiments, block 730 may be omitted from process 700. The ILB may include a material that is more chemically stable than the transition metal oxide(s) of the switching oxide layer (such as $AlO_x$, like $Al_2O_3$) described subsequently. For example, fabricating the interface layer B may involve depositing $AlO_x$, utilizing an atomic layer deposition (ALD) technique, a physical vapor deposition (PVD) technique, a reactive sputtering of Al technique, and/or any other suitable deposition technique. The second interface layer may be and/or include interface layer 405b as described in connection with FIG. 4E above.

At block 740, a second electrode may be fabricated on the switching oxide layer and/or the second interface layer. Fabricating the second electrode may involve fabricating one or more layers of one or more metallic materials that are electronically conductive and reactive to the switching oxide. For example, fabricating the second electrode may involve depositing one or more layers of Ta, utilizing a physical vapor deposition (PVD) technique, and/or any other suitable deposition technique. The second electrode may be and/or include second electrode 309 of FIG. 3D and/or second electrode 409 of FIG. 4E.

Figure 8:
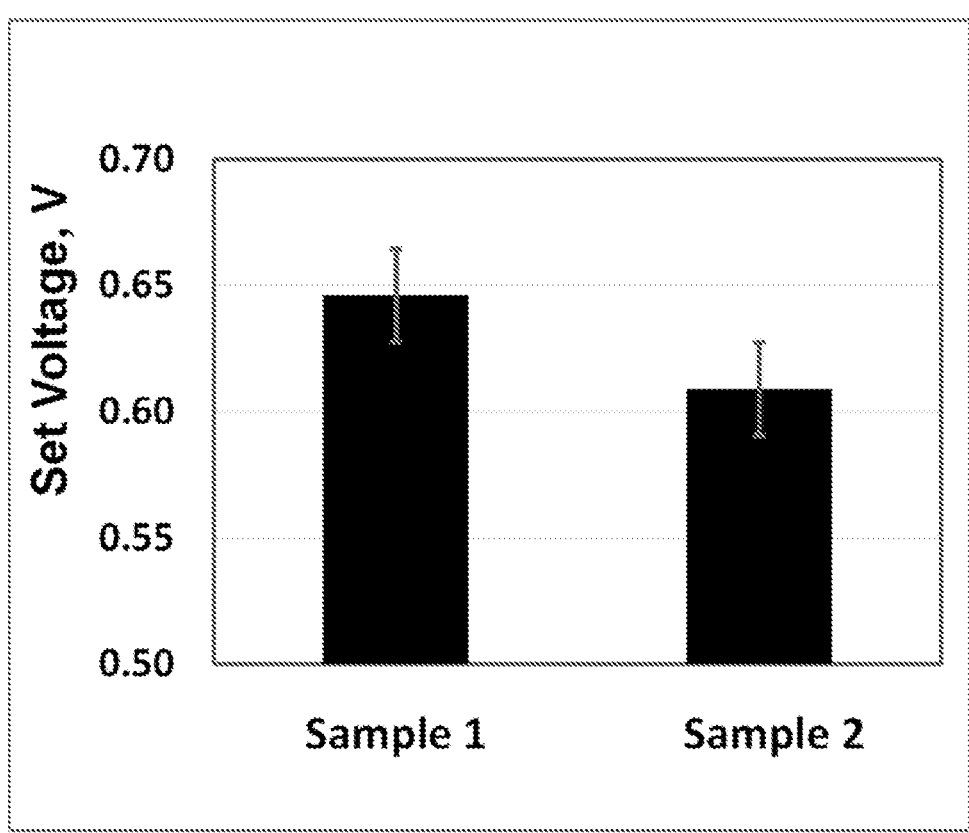
FIG. 8 is a table showing set voltages of example RRAM devices in accordance with some embodiments of the present disclosure.

FIG. 8 is a plot 800 showing set voltages of example RRAM devices in accordance with some embodiments of the present disclosure. Sample 1 corresponds to RRAM devices with no interface layer. Sample 2 corresponds to RRAM devices with an interface layer positioned between the first electrode and the switching oxide layer as described herein. The average set voltages and the error bars from Sample 1 and Sample 2 are compared in FIG. 8. As shown in FIG. 8, Sample 2 exhibit lower set voltages than that from Sample 1. This observation contradicts the prevalent understanding that introducing an interface layer into an RRAM device may increase, rather than decrease, the switching voltages of the device. The reduction in set and switching voltages may be attributed to the presence of "pin-holes" within the interface layer between the first electrode and the switching oxide. These pin-holes decrease the contact area between the first electrode and the switching oxide, effectively reducing the filament size during the switching process. This, in turn, results in the lowering of the switching voltage or energy.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" as used herein may mean within a range of normal tolerance in the art, such as within 2 standard deviations of the mean, within +20% of a target dimension in some embodiments, within +10% of a target dimension in some embodiments, within +5% of a target dimension in some embodiments, within +2% of a target dimension in some embodiments, within +1% of a target dimension in some embodiments, and yet within +0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:
   a resistive random-access memory (RRAM) device, comprising:
   a first electrode;
   a first interface layer fabricated on the first electrode, wherein the first interface layer comprises a discontinuous layer of a first dielectric material and a conductive material deposited in the discontinuous layer of the first dielectric material;
   a switching oxide layer fabricated on the first interface layer, the switching oxide layer comprising at least one transition metal oxide; and
   a second electrode fabricated on the switching oxide layer.

2. The apparatus of claim 1, wherein the first dielectric material comprises at least one of $Al_2O_3$, $SiO_2$, $Si_3N_4$, MgO, $Y_2O_3$, $Gd_2O_3$, $Sm_2O_3$, $CeO_2$, $Er_2O_3$, or $La_2O_3$.

3. The apparatus of claim 1, wherein the conductive material comprises a metal.

4. The apparatus of claim 1, wherein the conductive material comprises a conductive oxide.

5. The apparatus of claim 1, wherein the conductive material comprises a conductive nitride.

6. The apparatus of claim 1, wherein the discontinuous layer of the dielectric material comprises a plurality of islands of the first dielectric material, and wherein the conductive material is deposited between the plurality of islands of the first dielectric material.

7. The apparatus of claim 1, further comprising a second interface layer fabricated between the switching oxide layer and the second electrode, wherein the second interface layer comprises a discontinuous layer of a second dielectric material.

8. The apparatus of claim 7, wherein the second dielectric material comprises at least one of $Al_2O_3$, $SiO_2$, $Si_3N_4$, MgO, $Y_2O_3$, $Gd_2O_3$, $Sm_2O_3$, $CeO_2$, $Er_2O_3$, or $La_2O_3$.

9. The apparatus of claim 1, wherein the transition metal oxide comprises at least one of $HfO_x$ or $TaO_y$, wherein $x \leq 2.0$, and wherein $y \leq 2.5$.

10. The apparatus of claim 1, wherein the switching oxide layer comprises:
    a first base oxide layer comprising the at least one transition metal oxide; and
    a first geometric confining layer fabricated on the first base oxide layer, wherein the first geometric confining layer comprises a first plurality of pin-holes.

11. The apparatus of claim 10, wherein the switching oxide layer further comprises a second base oxide layer fabricated on the first geometric confining layer.

12. The apparatus of claim 11, wherein the second base oxide layer comprises at least one of $TaO_x$, $HfO_x$, $TiO_x$, or $ZrO_x$.

13. The apparatus of claim 11, wherein the switching oxide layer comprises a second geometric confining layer comprises a second plurality of pin-holes.

14. A method for fabricating a resistive random-access memory (RRAM) device, comprising:

fabricating a first interface layer on a first electrode, wherein the first interface layer comprises a discontinuous layer of a first dielectric material and a conductive material deposited in the discontinuous layer of the first dielectric material;

fabricating, on the first interface layer, a switching oxide layer comprising at least one transition metal oxide; and fabricating a second electrode on the switching oxide layer.

15. The method of claim 14, wherein the first dielectric material comprises at least one of $Al_2O_3$, $SiO_2$, $Si_3N_4$, $MgO$, $Y_2O_3$, $Gd_2O_3$, $Sm_2O_3$, $CeO_2$, $Er_2O_3$, or $La_2O_3$.

16. The method of claim 14, wherein fabricating the first interface layer comprises depositing the first dielectric material and the conductive material using at least one of an atomic layer deposition technique or a co-sputter deposition technique.

17. The method of claim 14, wherein the conductive material comprises at least one of a metal, a conductive oxide, or a conductive nitride.

18. The method of claim 14, further comprising fabricating a second interface layer on the switching oxide layer, wherein the second interface layer comprises a discontinuous layer of a second dielectric material, and wherein the second electrode is fabricated on the second interface layer.

19. The method of claim 18, wherein the second dielectric material comprises at least one of $Al_2O_3$, $SiO_2$, $Si_3N_4$, $MgO$, $Y_2O_3$, $Gd_2O_3$, $Sm_2O_3$, $CeO_2$, $Er_2O_3$, or $La_2O_3$.

20. The method of claim 14, wherein the transition metal oxide comprises at least one of $HfO_x$ or $TaO_y$, wherein $x \leq 2.0$, and wherein $y \leq 2.5$.

* * * * *